United States Patent
Holub et al.

(10) Patent No.: US 9,784,229 B2
(45) Date of Patent: Oct. 10, 2017

(54) VEHICLE INITIATED REMOTE ENGINE START FOR BATTERY CHARGE MAINTENANCE AND DRIVER INITIATED REMOTE ENGINE START FOR VEHICLE PRECONDITIONING HAVING BATTERY CHARGE MAINTENANCE PRIORITY

(71) Applicant: Ford Global Technologies, LLC, Dearborn, MI (US)

(72) Inventors: Patrick Kevin Holub, Novi, MI (US); John Robert Van Wiemeersch, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 227 days.

(21) Appl. No.: 14/476,044

(22) Filed: Sep. 3, 2014

(65) Prior Publication Data

US 2014/0379174 A1    Dec. 25, 2014

Related U.S. Application Data

(63) Continuation-in-part of application No. 13/043,676, filed on Mar. 9, 2011.

(51) Int. Cl.
*H02J 7/00* (2006.01)
*F02N 11/08* (2006.01)
(Continued)

(52) U.S. Cl.
CPC ........ *F02N 11/0807* (2013.01); *B60R 16/033* (2013.01); *B60R 25/00* (2013.01);
(Continued)

(58) Field of Classification Search
CPC ...................................................... Y02T 90/14
(Continued)

(56) References Cited

U.S. PATENT DOCUMENTS

| 4,296,334 A | 10/1981 | Wong |
| 4,488,521 A | 12/1984 | Miller et al. |

(Continued)

FOREIGN PATENT DOCUMENTS

EP    2679418 A1    1/2014

OTHER PUBLICATIONS

Innovation, National Renewable Energy Laboratory, NREL Reveals Links Among Climate Control, Battery Life, and Electric Vehicle Range, Jun. 2012.

*Primary Examiner* — Yalkew Fantu
(74) *Attorney, Agent, or Firm* — Frank A. MacKenzie; Brooks Kushman P.C.

(57) ABSTRACT

One method for remotely starting an engine of a vehicle includes notifying, from the vehicle, a remote user of the vehicle that a battery of the vehicle has a charge level below a predetermined threshold. This method includes remotely starting the engine to charge the battery with energy from the engine upon receiving from the user a confirmation to start the engine. Another method includes remotely starting the engine in response to a command, from the user, to start the engine for preconditioning the vehicle. This method assesses charge level of the battery following engine start and adjusts engine-on time and vehicle settings to prioritize battery charge maintenance versus preconditioning based on the charge level.

5 Claims, 3 Drawing Sheets

(51) Int. Cl.
  *G01R 31/36* (2006.01)
  *B60R 25/00* (2013.01)
  *B60R 16/033* (2006.01)
  *H02J 7/14* (2006.01)
  *H02J 9/00* (2006.01)

(52) U.S. Cl.
  CPC ...... *F02N 11/0862* (2013.01); *G01R 31/3606* (2013.01); *H02J 7/1438* (2013.01); *F02N 2200/061* (2013.01); *F02N 2300/306* (2013.01); *H02J 9/002* (2013.01)

(58) Field of Classification Search
  USPC ................................. 320/109, 104, 123, 124
  See application file for complete search history.

(56) References Cited

U.S. PATENT DOCUMENTS

| | | | |
|---|---|---|---|
| 5,818,115 A * | 10/1998 | Nagao | F02N 11/04 180/65.1 |
| 6,028,372 A | 2/2000 | West et al. | |
| 6,492,741 B1 * | 12/2002 | Morimoto | B60L 11/12 180/65.1 |
| 6,561,151 B1 | 5/2003 | Wisnia et al. | |
| 7,091,822 B2 * | 8/2006 | Flick | G08C 17/02 340/5.2 |
| 7,146,959 B2 | 12/2006 | Thompson et al. | |
| 7,647,908 B1 * | 1/2010 | Biondo | F02D 28/00 123/179.2 |
| 8,112,185 B2 * | 2/2012 | Wu | B60R 25/045 123/179.12 |
| 2006/0080007 A1 | 4/2006 | Gerard et al. | |
| 2008/0179040 A1 | 7/2008 | Rosenbaum | |
| 2010/0161481 A1 * | 6/2010 | Littrell | B60L 3/12 705/40 |
| 2011/0071720 A1 * | 3/2011 | Schondorf | G06Q 10/06 701/29.5 |
| 2011/0163718 A1 | 7/2011 | Van Wiemeersch | |
| 2011/0163721 A1 | 7/2011 | Van Wiemeersch | |
| 2011/0224841 A1 | 9/2011 | Profitt-Brown et al. | |
| 2013/0271074 A1 * | 10/2013 | Federico | G06F 7/00 320/109 |
| 2014/0039735 A1 | 2/2014 | Major et al. | |

* cited by examiner

VEHICLE INITIATED REMOTE ENGINE START FOR BATTERY CHARGE MAINTENANCE AND DRIVER INITIATED REMOTE ENGINE START FOR VEHICLE PRECONDITIONING HAVING BATTERY CHARGE MAINTENANCE PRIORITY

CROSS-REFERENCE TO RELATED APPLICATIONS

This application is a continuation-in-part of U.S. application Ser. No. 13/043,676, filed Mar. 9, 2011, the disclosure of which is hereby incorporated in its entirety by reference herein.

TECHNICAL FIELD

The present disclosure relates to vehicle initiated vehicle engine starting for vehicle battery charge maintenance and driver initiated remote vehicle engine starting for vehicle preconditioning.

BACKGROUND

Remote engine start systems enable a vehicle user to remotely start the engine of a vehicle while still leaving the vehicle immobilized (i.e., unable to be driven away without a valid key read). Remote engine start for cabin preconditioning is common in vehicles. A vehicle user, such as the driver, initiates engine starting to precondition the cabin by remotely commanding the remote engine start system to start the engine. For instance, the driver is inside a house and is thereby 'remote' from the vehicle parked outside. Some remote engine start systems control aspects of the climate control system and engine run time duration to minimize fuel usage and emissions during such engine starting. For instance, the engine run time duration may be variable versus fixed, and climate control settings may be automatically adjusted from the previous drive cycle to minimize engine-on time required to reach target preconditioning thresholds versus using manually pre-set controls from the preceding drive event.

Repetitive short drive cycles, particularly during periods of cold ambient temperatures, may result in frequent and prolonged periods of negative battery charge margin due to insufficient engine-on time to replenish battery charge. The result is a chronically decreasing battery state-of-charge (SOC) and eventual battery depletion. If such drivers have and utilize remote engine start capability among these short drive cycles, the subject of the present disclosure can offset these charge losses during remote engine start events to diminish or completely eliminate such battery depletion.

Vehicle initiated engine start systems may autonomously (e.g., automatically without vehicle user involvement) start the engine of a vehicle. For instance, the engine may be autonomously started for battery charge maintenance to address low battery SOC conditions when they are detected. Certain autonomous engine start systems utilize battery recharge prioritized behaviors in lieu of behaviors optimized for cabin preconditioning. A concern with autonomous engine start systems is anxiety associated with starting vehicles without vehicle user involvement. The subject of the present disclosure can realize such battery recharge prioritized behavior without complete vehicle autonomy and the anxiety it creates.

SUMMARY

A first embodiment of the present invention provides a method for vehicle initiated remote starting an engine of a vehicle. The method includes notifying, from the vehicle, a remote user of the vehicle that a battery of the vehicle has a charge level below a predetermined threshold. The method further includes remotely starting the engine to charge the battery with energy from the engine upon receiving from the user a confirmation to start the engine.

A remote engine start system corresponding to the method of the first embodiment is also provided. The system includes a controller configured to use a communications device of the vehicle to notify a remote user of the vehicle that a battery of the vehicle has a charge level below a predetermined threshold and to start the engine to charge the battery with energy from the engine upon receiving from the user a confirmation to start the engine.

When a vehicle system does not include such a communication device or does not have the controls or other hardware (e.g., GPS) necessary to autonomously initiate a remote engine start, a method for remotely starting the engine of the vehicle in accordance with a second embodiment of the present invention can be incorporated to augment the battery charge maintenance of driver initiated remote starts.

The method in accordance with the second embodiment includes remotely starting the engine in response to a command, from a remote user of the vehicle, for preconditioning a cabin or engine of the vehicle. This method includes the vehicle assessing the charge level and condition of the battery following engine start and adjusting engine-on time and vehicle settings to prioritize (e.g., adjust apportionment of) battery charge maintenance versus preconditioning based on the urgency of the battery conditions. This method further includes charging the battery with the energy from the engine apportioned for charging the battery and preconditioning the vehicle with the energy apportioned for preconditioning.

The methods in accordance with the first and second embodiments may coexist with one another on the same vehicle.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
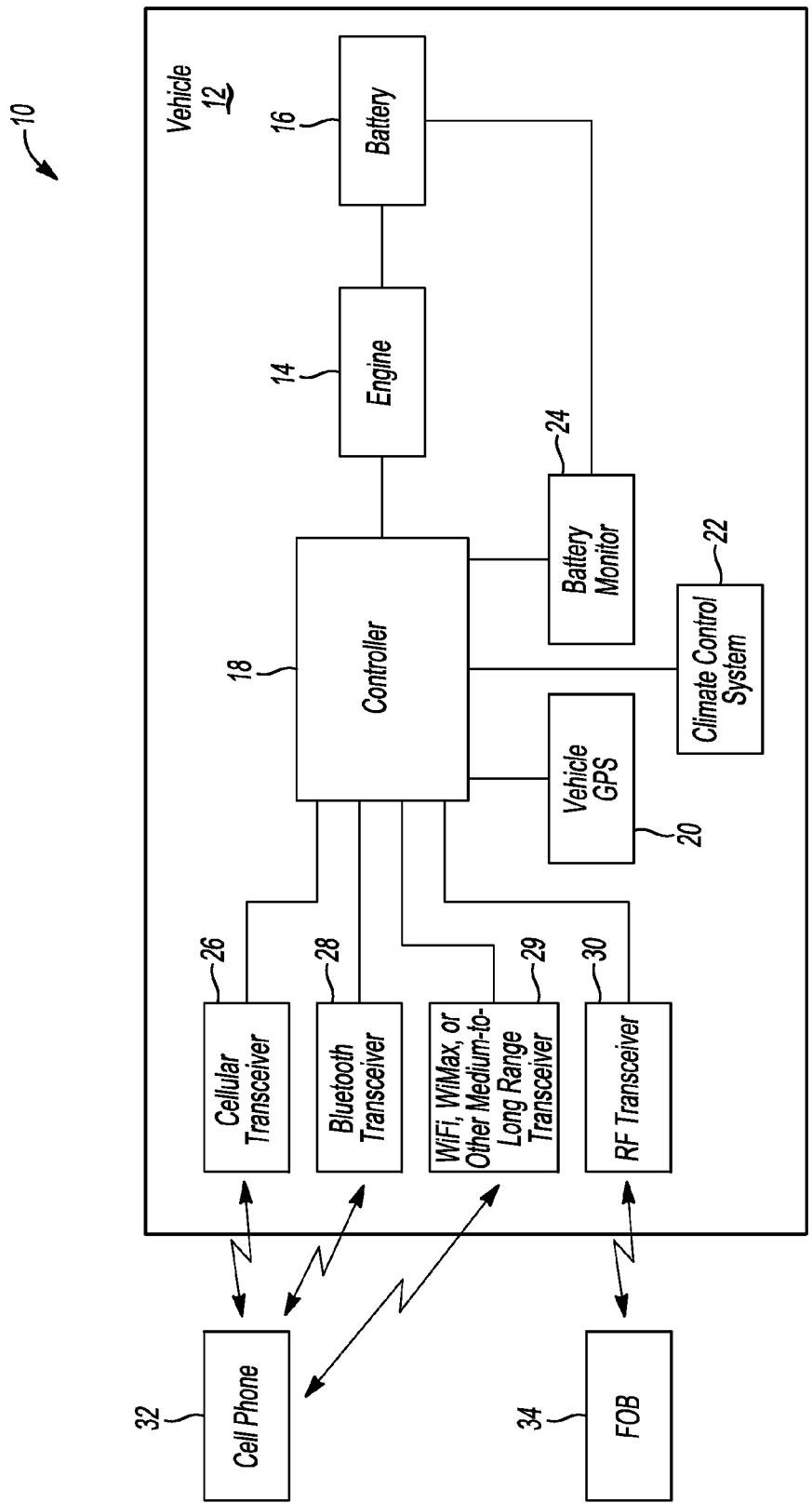
FIG. 1 illustrates a block diagram of a remote engine start system for a vehicle in accordance with an embodiment of the present invention.

Referring now to FIG. 1, a block diagram of a remote engine start system 10 for a vehicle 12 in accordance with an embodiment of the present invention is shown. Remote engine start system 10 is configured to enable a user or a keeper of vehicle 12 (e.g., the vehicle driver, a storage lot supervisor/attendant, or the like; herein "driver") to remotely start engine 14 of the vehicle. Remote engine start system 10 includes (i) a vehicle initiated remote engine start mode and (ii) a driver initiated remote engine start mode. The vehicle initiated remote engine start is initiated on the vehicle side to start engine 14 for charge maintenance of battery 16 of vehicle 12. Battery 16 may include multiple separate batteries (ex., dual battery vehicles). The driver initiated remote engine start is initiated on the driver side to start engine 14 for preconditioning vehicle 12. The driver initiated remote engine start mode includes a charge maintenance priority for charging battery 16. The preconditioning of the cabin of vehicle 12 is therefore adjusted according to the higher priority of charge maintenance of battery 16 and the run time is a balance of conserving fuel but still ensuring sufficient charge for the next engine start event.

In general, the vehicle initiated remote engine start mode of remote engine start system 10 includes: the vehicle side monitoring the state-of-charge (SOC) of battery 16 and detecting when the battery SOC falls below a predetermined low threshold; the vehicle side contacting the driver to advise of the low battery SOC; the driver authorizing the remote engine start based on the driver's knowledge of the location and state of vehicle 12; and performing charge maintenance of battery 16 using energy from the engine to increase the battery SOC such as to a predetermined high threshold.

In general, the driver initiated remote engine start mode of remote engine start system 10 includes: the driver remotely starting engine 14 based on the driver's desire to precondition vehicle 12; and performing preconditioning using energy from the engine via battery 16 in conjunction with performing charge maintenance of the battery using energy from the engine to increase the battery SOC such as to the predetermined high threshold, the battery charge maintenance being prioritized over vehicle preconditioning. In this mode the charge level and condition of battery 16 following engine start are assessed and engine-on time and vehicle settings are adjusted to prioritize battery charge maintenance versus preconditioning based on the urgency of the battery health conditions.

As shown in FIG. 1, remote engine start system 10 includes a controller 18. Controller 18 is configured for providing (i.e., controlling) the vehicle initiated remote engine start and driver initiated remote engine start modes. Controller 18 is a processor-based module of a vehicle control module system capable of being configured for providing the modes of operation. For instance, controller 18 is a vehicle body controller of vehicle 12. Controller 18 includes a processor, memory, an input-output (I/O) interface, and instructions (or programs). The memory and the I/O interface are coupled to the processor for allowing communication of information between one another. The I/O interface is configured for allowing communication of information between controller 18 and other systems, modules, controllers, devices, etc., of vehicle 12. The programs, which are configured to cause vehicle initiated remote engine start and driver initiated remote engine start modes of operation, are stored on the memory and are accessible therefrom by the processor. During operation, the processor executes one or more of the programs to execute steps of the vehicle initiated remote engine start and driver initiated remote engine start modes of operation and/or various steps thereof such as those described in connection with the operations depicted in FIGS. 2A and 2B. In one specific embodiment, the instructions are tangibly embodied. As such, the memory represents an example of a processor-readable medium having instructions tangibly and non-transiently embodied thereon that are configured for carrying out functionality in accordance with the vehicle initiated remote engine start and driver initiated remote engine start modes of operation.

Vehicle 12 further includes a climate control system 22 and a battery monitor 24, and may include a vehicle global positioning system (GPS) 20. As explained in greater detail herein, controller 18 is in communication with each of vehicle GPS 20, climate control system 22, and battery monitor 24 in order for the controller to carry out various steps of the vehicle initiated remote engine start and driver initiated remote engine start modes of operation. Vehicle GPS 20 is operable to provide vehicle location coordinates indicative of the current position of vehicle 12. Controller 18 is configured to obtain the vehicle location coordinates from vehicle GPS 20. Climate control system 22 is, for example, a heating, ventilation, and air conditioning (HVAC) system of vehicle 12. Climate control system 22 uses electrical energy from battery 16 to conduct its HVAC operations. Controller 18 is configured to control climate control system 22. Battery monitor 24 is operable to monitor characteristics of battery 16 including the battery SOC. Controller 18 is configured to obtain the monitored battery characteristics including the battery SOC from battery monitor 24.

Vehicle 12 further includes one or more communication devices for communicating with corresponding communication devices of the driver. In this system, vehicle 12 includes a cellular transceiver 26, a Bluetooth transceiver 28, a medium-to-long range communication transceiver 29 (e.g., WiFi, WiMax, DRSC, Zig-Bee, Satellite, etc.), and a radio-frequency (RF) transceiver 30. In this system, the corresponding communication devices of the driver include a cell phone 32 and a keyless fob 34. Cell phone 32 may alternatively be a computer device such as a laptop or tablet computer.

Cellular transceiver 26 is operable to communicate via a cellular network with cell phone 32. For instance, cellular transceiver 26 is associated with an embedded modem and/or cell phone of vehicle 12. Such communications between cellular transceiver 26 and cell phone 32 may take place when the driver with the cell phone is far from vehicle 12. Bluetooth transceiver 28 is operable to communicate via Bluetooth with cell phone 32. Medium-to-long range transceiver 29 is operable to communicate via a WiFi network or other systems with cell phone 32. Such communications may take place when the driver with cell phone 32 is nearby or within vehicle 12. Cellular transceiver 26 and Bluetooth transceiver 28 can communicate information including text messages, alerts, control signals, data, and the like to and from cell phone 32 at globe wide distances. RF transceiver 30 is operable to communicate with fob 34. Such communications typically are for remote keyless entry and passive entry passive start vehicle control functions. In the operation of remote engine start system 10, RF transceiver 30 communicates low battery SOC alerts or the like to fob 34 as described in greater detail herein.

Controller 18 is in communication with each of cellular transceiver 26, Bluetooth transceiver 28, medium-to-long range transceiver 29, and RF transceiver 30. As such, controller 18 can direct communications to cell phone 32 and fob 34 via cellular transceiver 26, Bluetooth transceiver 28, medium-to-long range transceiver 29 and RF transceiver 30. Likewise, controller 18 can receive communications from cell phone 32 and fob 34 via cellular transceiver 26, Bluetooth transceiver 28, medium-to-long range transceiver 29, and RF transceiver 30.

Figure 2A:
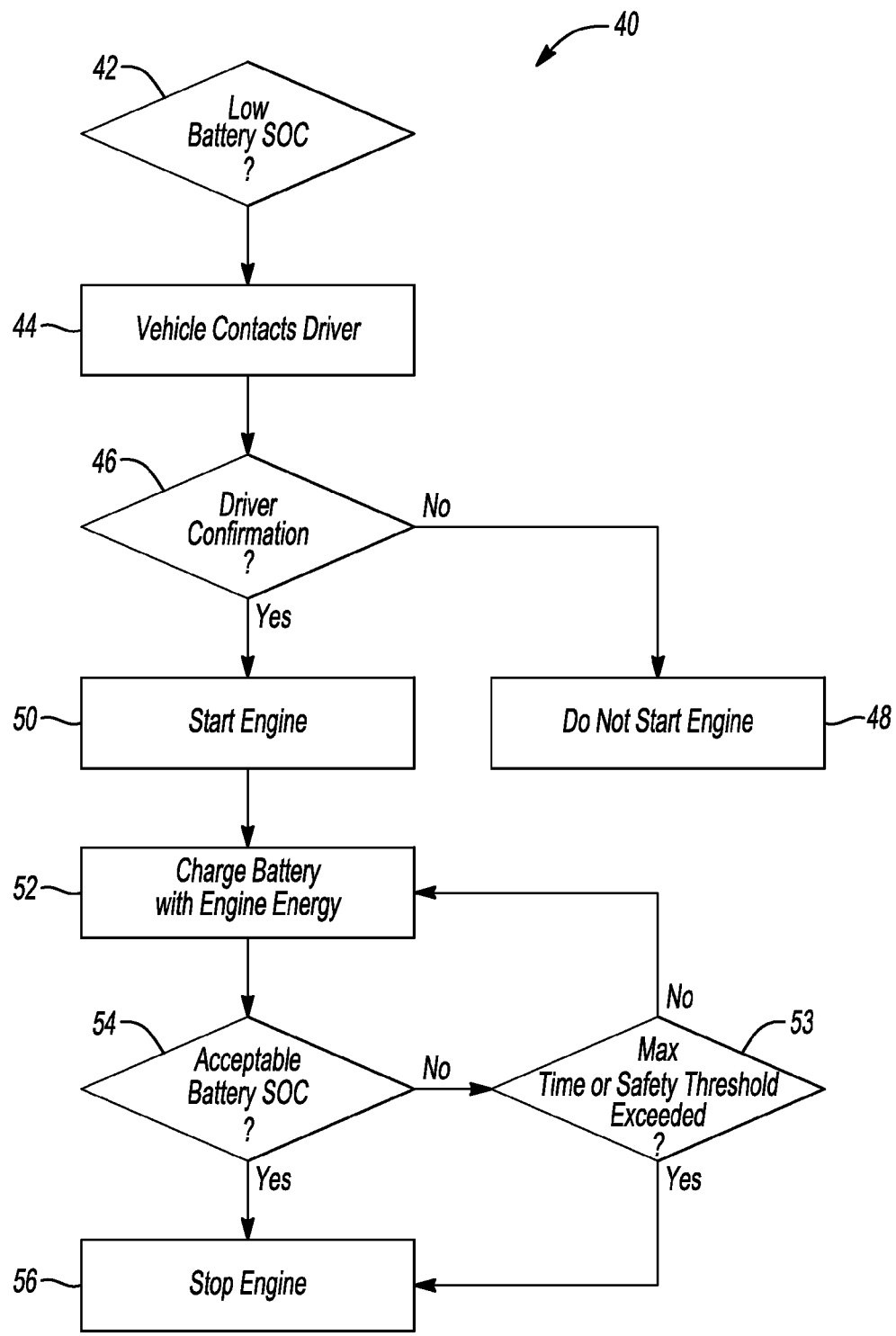
FIG. 2A illustrates a flowchart depicting operation of a vehicle initiated remote engine start mode of the remote engine start system.

Referring now to FIG. 2A, with continual reference to FIG. 1, a flowchart 40 depicting operation of the vehicle initiated remote engine start mode of remote engine start system 10 is shown. The operation begins when vehicle 12 is parked and shut off. Battery monitor 24 periodically monitors the SOC of battery 16. Preferably, in order to conserve power, battery monitor 24 should not wake controller 18 unless the battery SOC has crossed a threshold of concern. However, vehicle 12 may also be designed such that controller 18 obtains the battery SOC from battery monitor 24 to detect whether the battery SOC is below a predetermined low threshold as indicated in decision block 42. Upon the battery SOC falling below the predetermined low threshold, controller 18 controls one or more of the communication devices of vehicle 12 to communicate with one or more of the communications devices of the driver in order to contact the driver as indicated in block 44. Controller 18 contacts the driver to advise the driver of the low battery SOC. Controller 18 may also provide the vehicle location coordinates with the low battery SOC advisement to the driver.

In response to receiving the low battery SOC advisement, the driver can decide whether or not to remotely start engine 14 in order to perform charge maintenance of battery 16 to increase the battery SOC as indicated in decision block 46. Engine 14 is not started autonomously in response to the low battery SOC as indicated in block 48. Controller 18 causes engine 14 to be started upon the driver remotely starting the engine as indicated in block 50. The driver may remotely start engine 14 by transmitting a corresponding control signal or the like from one or more of the communication devices of the driver to one or more of the communication devices of vehicle 12. It is intended that the driver authorizes the remote engine start based on the driver's knowledge of the location of vehicle 12. The location of vehicle 12 may already be known by the driver and/or the driver may be made aware of the location of the vehicle from vehicle location information provided from controller 18 with the low battery SOC advisement.

In the event that the driver chooses to not start vehicle 12, the vehicle may then enter a state of recurring notices at predetermined intervals. For example, if the first notice is ignored, then vehicle 12 may send a second notice when battery 16 has depleted another 15% and may send a final notice when only 15% reserve is left for a successful crank event. These warnings may result in the driver choosing to go to the site of vehicle 12 and make a direct supervised start.

If/when started, energy from the started engine 14 is then used to perform the charge maintenance of battery 16 as indicated in block 52. The charge maintenance is performed to increase the battery SOC such as to a predetermined high threshold. Battery monitor 24 monitors the battery SOC as battery 16 is being charged with energy from engine 14. Controller 18 obtains the battery SOC from battery monitor 24 to detect whether the battery SOC rises to the predetermined high threshold as indicated in decision block 54. Upon the battery SOC rising to the predetermined high threshold for specified duration, controller 18 stops engine 14 as indicated in block 56. A maximum time or safety threshold loop for performing charge maintenance of battery 16 pursuant to block 52 may be provided as indicated in decision block 53. Controller 18 may also choose to stop the engine earlier if remaining fuel becomes a greater concern than the battery SOC or if any engine faults are detected (ex., OBDII class engine fault).

Vehicles without a battery monitor 24 may instead use a calendar based cadence that looks at both time since last start and GPS specific temperature for the vehicle location to determine that an engine start is likely needed to ensure proper battery health and SOC. Either the vehicle or a cloud SDN (Service Delivery Network) could then contact the driver for authorization and, if authorized, then contact the vehicle and instruct it that permission was obtained to start.

As described, for vehicles equipped with a cellular transceiver 26 (e.g., embedded modem and/or cell phone), anxiety and difficulty associated with completely autonomous engine starts can be solved by having the vehicle call and inform the driver of the low battery SOC and confirm acceptability of proceeding with a remote engine start to address the low battery SOC based on the driver's prior knowledge of the vehicle location or current vehicle location information (e.g., GPS based) provided at that time.

For vehicles without cellular transceiver 26 (i.e., without embedded modems/cellphones), the other communication devices of vehicle 12 may be used to contact and advise the driver of the low battery SOC and secure the driver's approval of the vehicle initiated remote engine start. For instance, controller 18 can instruct RF transceiver 30 to communicate with fob 34 to advise the driver of the low battery SOC. The advisement may take the form of a LED of fob 34 flashing periodically, the fob vibrating, text display on fobs with screens, etc. Such fobs typically have 40-100 m of range so the driver with fob 34 has to be relatively near vehicle 12 to receive the low battery SOC advisement. The driver could then use fob 34 to remotely convey to controller 18 the driver's approval of the vehicle initiated remote engine start.

As another example, controller 18 can instruct Bluetooth transceiver 28 or medium-to-long range transceiver 29 to communicate with cell phone 32 to advise the driver of the low battery SOC and secure the driver's approval of the vehicle initiated remote engine start. Such communication may be conducted via a Bluetooth connection between Bluetooth transceiver 28 and cell phone 32. Similarly, such communication may be conducted via a WiFi connection between medium-to-long range transceiver 29 and cell phone 32. The communication may be via the home WiFi router or WiFi network spread over a vehicle storage lot such as that at an OEM assembly plant storage lot or an airport parking structure. The advisement may be sent over WiFi or as an email message via the WiFi internet connection.

Figure 2B:
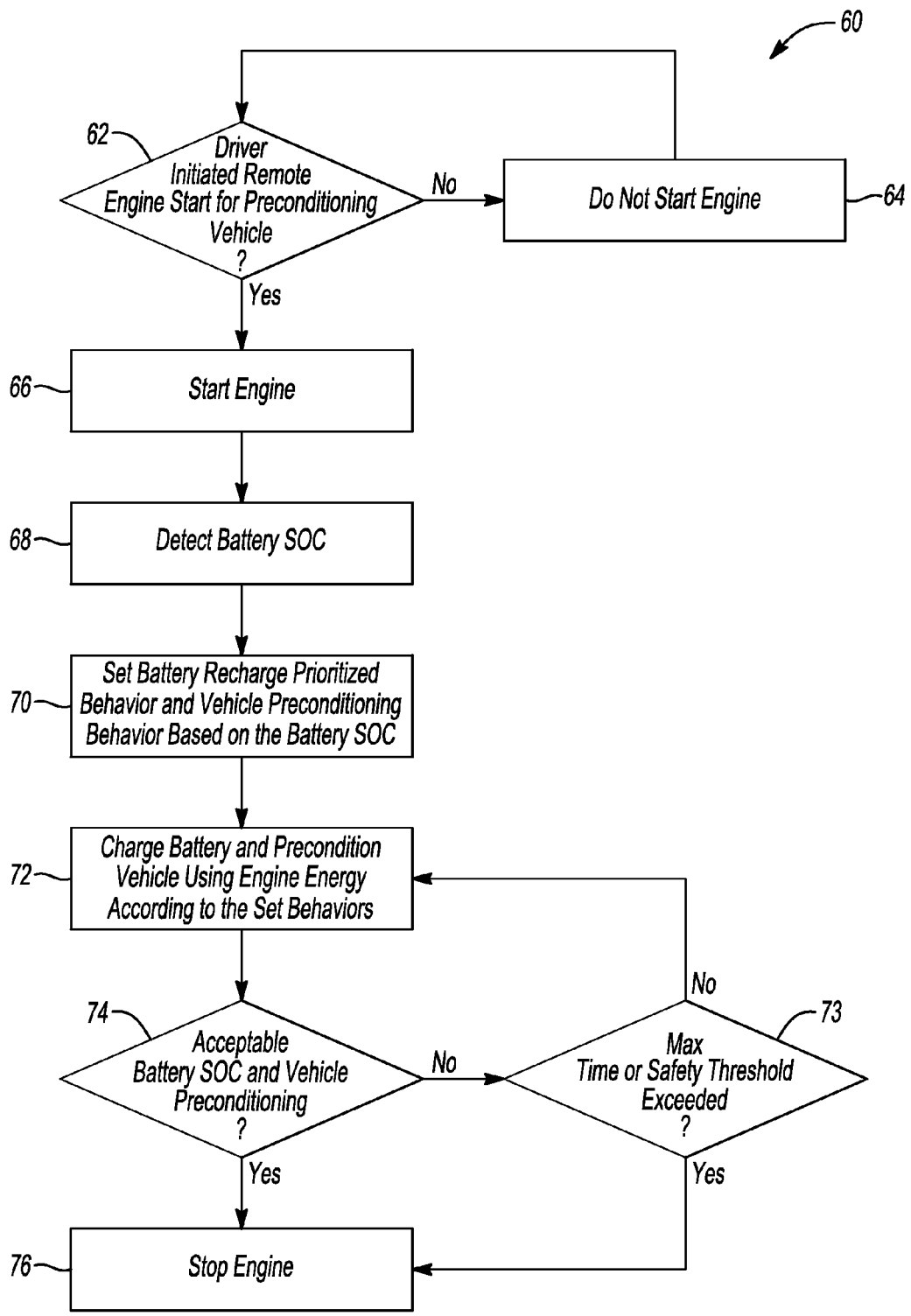
FIG. 2B illustrates a flowchart depicting operation of a driver initiated remote engine start mode of the remote engine start system.

Referring now to FIG. 2B, with continual reference to FIG. 1, a flowchart 60 depicting operation of the driver initiated remote engine start mode of remote engine start system 10 is shown. The operation begins when vehicle 12 is parked and shut off. Controller 18 waits to receive a remote engine start command from the driver as indicated in decision block 62. The driver provides the remote engine start command when the driver wants to precondition vehicle 12. Engine 14 is not started until the driver provides the remote engine start command as indicated in block 64. Controller 18 causes engine 14 to be started upon the driver remotely starting the engine by providing the remote engine start command to the controller as indicated in block 66. The driver may remotely start engine 14 by transmitting the remote engine start command from one or more of the communication devices of the driver to one or more of the communication devices of vehicle 12.

It is intended that the driver authorizes the remote engine start based on the driver's knowledge of the location and state of vehicle 12. The location of vehicle 12 may already be known by the driver. Alternately, the driver may be made aware of the location of vehicle 12 by receiving the vehicle location information from controller 18 upon request by the driver.

Upon engine 14 being started, battery monitor 24 detects the SOC of battery 16 and provides the battery SOC to controller 18 as indicated in block 68. Controller 18 uses the battery SOC to set a priority of the energy from started engine 14 to be used between charge maintenance of battery 16 and vehicle preconditioning. The charge level and condition of the battery following engine start are assessed and engine-on time and vehicle settings are adjusted to prioritize battery charge maintenance versus preconditioning based on the urgency of the battery conditions. The battery charge maintenance is given a higher priority. For instance, controller 18 sets a battery recharge prioritized behavior in lieu of typical vehicle preconditioning behavior based on the battery SOC as indicated in block 70.

Energy from the started engine 14 is then used to perform charge maintenance of battery 16 and vehicle preconditioning according to the priority schedule as indicated in block 72. The charge maintenance is performed to increase the battery SOC (presumably, already above the predetermined low threshold) such as to the predetermined high threshold. Battery monitor 24 monitors the battery SOC as battery 16 is being charged with energy from engine 14. Controller 18 obtains the battery SOC from battery monitor 24 to detect whether the battery SOC rises to the predetermined high threshold as indicated in decision block 74. Upon the battery SOC rising to the predetermined high threshold for specified duration, controller 18 stops battery 16 from being charged further. Upon the vehicle preconditioning being acceptable as indicated in decision block 74 and after the battery SOC has been raised to the predetermined high threshold, controller 18 stops engine 14 as indicated in block 76. A maximum time or safety threshold loop for performing charge maintenance of battery 16 and vehicle preconditioning pursuant to block 72 may be provided as indicated in decision block 73.

As described, for vehicles without any of the communication systems or methods described above for vehicle initiated remote engine starts for battery charge maintenance, driver initiated remote engine starts can be used to accomplish the same battery charge maintenance by including such logic into existing, driver initiated, smart remote start controls (i.e., those with only climate preconditioning and fuel minimization objectives) and adjusting the priority of the conflicting strategies based on the relative urgency of the required battery SOC maintenance.

In operation, during the first several seconds after a driver initiated remote engine start has been activated, several initial vehicle conditions can be measured and/or estimated as input to control this prioritization and the resultant behavior. The following is exemplary for a cold weather heating scenario: (1) battery SOC, state-of-health (SOH), and estimated temperature to determine charge deficit, maximum charge acceptance rate, and estimated charge times required with the various levels of electrical load shed available; (2) cabin air temperature (and implied interior surface temperatures); (3) engine coolant (ECT), oil and/or air charge temperatures to calculate the temperature time constants and estimate the associated engine-on time required to reach target ECT temperature for (a) HVAC blower start and (b) desired level of air discharge temperature for immediate driver comfort on drive-away.

Under perfect conditions with full battery SOC and SOH, engine-on time is regulated between some lower and upper time boundaries (e.g., between two and twenty minutes) using conventional cabin comfort shutdown metrics and algorithms for achieving such states in as rapid and fuel efficient way as possible. Preferred resistive heating elements are activated immediately following engine start to facilitate the highest level of cabin comfort for drivers that begin their drive cycles prior to completion of the preconditioning engine-on cycle. Negative charge margin during such preconditioning events are not of concern since the subsequent drive cycle is expected to replenish any lost SOC.

Under worst case battery SOC and SOH conditions, battery recharge is prioritized at the exclusion of discretionary electrical loads, and engine-on time is extended to the maximum without regard to fuel consumption or overachieving any target temperatures that result from the longer engine-on times (e.g. those associated with the coolant supplied heat source). Electric resistive heating and interior peltier heating/cooling devices are inhibited until imminent passenger occupancy (e.g., driver door ajar) or through the end of the preconditioning engine-on cycle. HVAC fan usage may continue with available engine supplied heat only, but perhaps at lower than optimal fan speeds. Other known charge-priority behaviors are also employed such as engine idle speed boost.

For vehicles with SOC and SOH conditions in-between these extremes, various compromises to these ideal functional states are employed to facilitate the best balance between the comfort/FE objectives and battery maintenance objectives based on conditions measured and estimated during the first several seconds of engine-on time, for example: (1) activation of resistive heating and interior peltier heating/cooling devices is delayed until minimum SOC criteria are met or until an activation time that will achieve certain minimum temperature objectives just prior to completion of the preconditioning engine-on cycle (i.e., by using predicted engine-on time and predicted resistive heating rates/time for affected cabin temperatures); (2) partial power is supplied to resistive heating and interior peltier heating/cooling devices; (3) engine-on time is extended (but not necessarily maximized); or (4) some combination of these.

In this way, vehicles without a communications system and/or method to solicit and receive vehicle user authorization for dedicated engine starts for battery SOC maintenance enables these charge maintenance checks and actions to address this problem as a first priority for each driver initiated remote engine start.

As described, a remote engine start system in accordance with embodiments of the present invention provides vehicle battery charge maintenance capability in driver initiated remote engine start controls and allows for such vehicle battery charge maintenance capability in vehicles without systems or methods to autonomously initiate remote starts for such purposes.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method comprising:
communicating, from a vehicle, to a cellular device or a keyless fob of a remote user a notification that a battery of the vehicle has a low charge level with a location of the vehicle upon the charge level falling below a threshold; remotely starting an engine of the vehicle to charge the battery with energy upon receiving from the user a confirmation to start the engine in response to the notification.

2. The method of claim 1 wherein:
the step of communicating includes using a communications device of the vehicle and a communications device of the user.

3. The method of claim 2 wherein:
the communications device of the vehicle is at least one of a cellular transceiver, a Bluetooth transceiver, a WiFi transceiver, a WiMax transceiver, and a radio-frequency transceiver.

4. A remote engine start system for a vehicle, comprising:
a controller configured to use a communications device of the vehicle to communicate to at least one of a cellular device and a keyless fob of a remote user of the vehicle a notification that a battery of the vehicle has a charge level below a predetermined threshold with information indicative of a location of the vehicle upon the charge level falling below the predetermined threshold and to start the engine to charge the battery with energy from the engine upon remotely receiving from the user a confirmation to start the engine in response to the notification.

5. The system of claim 4 wherein:
the communications device of the vehicle is at least one of a cellular transceiver, a Bluetooth transceiver, a WiFi transceiver, a WiMax transceiver, and a radio-frequency transceiver.

* * * * *